United States Patent [19]
Adams et al.

[11] Patent Number: 5,326,161
[45] Date of Patent: Jul. 5, 1994

[54] ASSEMBLY AND ELASTOMERIC SEATING MEMBER FOR PROVIDING A FLEXABLE SEAT FOR A MEMBER

[75] Inventors: Graham L. Adams; Guenter Trach, both of Hessen, Fed. Rep. of Germany

[73] Assignee: Motorola, Inc., Schaumburg, Ill.

[21] Appl. No.: 910,290

[22] PCT Filed: Nov. 7, 1991

[86] PCT No.: PCT/EP91/02103
§ 371 Date: Sep. 4, 1992
§ 102(e) Date: Sep. 4, 1992

[87] PCT Pub. No.: WO92/08630
PCT Pub. Date: May 29, 1992

[30] Foreign Application Priority Data
Nov. 17, 1990 [GB] United Kingdom ............. 9025030

[51] Int. Cl.$^5$ ................. B60T 8/36; H02G 3/08
[52] U.S. Cl. ................. 303/119.2; 174/65 R; 174/65 G; 361/776
[58] Field of Search ............ 303/119.2; 174/65 R, 174/65 G, 65 SS; 361/408

[56] References Cited

U.S. PATENT DOCUMENTS

| | | | |
|---|---|---|---|
| 2,225,472 | 12/1940 | Franklin | 179/65 G |
| 4,145,566 | 3/1979 | Wengartner | 174/65 R |
| 5,022,717 | 6/1991 | Heibel et al. | 303/119.2 |
| 5,037,318 | 8/1991 | Robertson | 174/65 R |
| 5,040,853 | 8/1991 | Burgborf et al. | 303/119.2 |
| 5,141,298 | 8/1992 | Von Hayn et al. | 303/119.2 |

FOREIGN PATENT DOCUMENTS

| | | |
|---|---|---|
| 0278544 | 8/1988 | European Pat. Off. . |
| 0373551 | 6/1990 | European Pat. Off. . |
| 824655 | 7/1949 | Fed. Rep. of Germany . |
| 2647043 | 5/1977 | Fed. Rep. of Germany . |
| 3742320 | 6/1989 | Fed. Rep. of Germany . |
| 3810788 | 10/1989 | Fed. Rep. of Germany . |
| 2402323 | 3/1979 | France . |
| 946784 | 1/1964 | United Kingdom . |
| WOA8910286 | 11/1989 | World Int. Prop. O. . |
| WO90/06609 | 6/1990 | World Int. Prop. O. . |

*Primary Examiner*—Matthew C. Graham
*Attorney, Agent, or Firm*—Phillip H. Melamed

[57] ABSTRACT

An elastomeric seating member and an assembly incorporating the same, particularly for solenoid coils of solenoid valves in ABS systems, is provided. The elastomeric seating member (40) provides a moisture resistant seal between a first housing (24) in which first members, such as the solenoid coils (26), are mounted and a second housing (48) in which electronic circuitry, such as the electronic control circuitry (38) for the solenoid valves, is mounted. The elastomeric seating member is mounted within a bore (32, 32a) communicating between the first and second housings and provides a seat for the solenoid coils and is arranged to permit the solenoid coils a limited amount of movement so that when the first housing is mounted on a valve block (20) comprising switch parts (30) of the solenoid valve, the elastomeric seating member permits the movement of the solenoid coils for alignment with the switch parts (30). The solenoid coils are coupled to the electronic circuitry in the second housing by way of wires (34) which extend from the solenoid coils through a bore (50) in the elastomeric seating member. The wires are electrically coupled to contacts on integral flexible finger portions (46) of a circuit board containing the electronic circuitry.

19 Claims, 3 Drawing Sheets

— PRIOR ART —

ASSEMBLY AND ELASTOMERIC SEATING MEMBER FOR PROVIDING A FLEXABLE SEAT FOR A MEMBER

FIELD OF THE INVENTION

This invention relates to an elastomeric seating member and an assembly incorporating the same, particularly though not exclusively for solenoid coils of antilock brake system controllers (ABS).

BACKGROUND ART

In ABS systems, it is known to connect the solenoid coils of the solenoid valves to electronic control circuitry remote from the coils by way of a conductive card (2), as shown in FIG. 1. The electronic control circuitry (not shown) is not located in the housing (4) since the circuitry can be damaged by the ambient conditions such as temperature, vibration and moisture.

The conductive card (2) is mounted in a housing (4), which also contains an array of electric solenoids (8) (only one of which is shown). Housing (4) is mounted on a valve block (10) which is of ferromagnetic material and which conducts the magnetic flux developed by solenoid coils (8). The valve block (10) comprises a plurality of domes (11) (only one of which is shown) containing mechanical switch parts (12) of the solenoid valves. Each coil (8) is annular and surrounds a respective one of the domes (11). It is important that the coil (8) is aligned accurately with respect to the dome (11) in order to obtain optimum magnetic flux. The solenoid coil (8) is coupled to conductive card (2) through holes (3) in the conductive card (2) via two stiff wire leads (14). Thus, it is important that the wire leads (14) are accurately aligned with the holes (3). Such a need for accurate alignment increases the difficulty of attaching the solenoids via the leads (14) to the conductive card (2) and increases the production costs. Furthermore, it is necessary to accurately align the solenoids (8) relative to the switch parts in blocks (10) which also increases the production costs.

To assemble this arrangement, electrical connections must be made between the control circuitry (not shown) and the conductive card (2) and between the conductive card and the solenoid coils (8)

This arrangement suffers from a number of additional disadvantages and problems due to the necessitated separation of the control circuitry and solenoid valves. For instance, a significant amount of space is required for the solenoid valves and the control circuitry, additional electrical connections must be made during assembly, the conductive card and the leads (14) can be damaged during assembly, and the conductive card may be subject to corrosion particular since the connection of the housing (4) to the valve block (10) does not provide a sufficient seal to protect the card (2) from ambient conditions.

SUMMARY OF THE INVENTION

It is a principal object of the invention to overcome the above mentioned problem of accuracy in alignment.

The present invention provides an assembly comprising first and second housings, the first housing containing an array of first members mounted therein, said first members having respective wires extending therefrom for coupling said first members to electronic means within the second housing, an elastomeric seating member mounted within a bore communicating between the first and second housings in order to provide a seat for the first member and to permit the first member a small amount of movement, the respective wire extending through the seating member.

An advantage of the present invention is that the elastomeric seating member permits movement of the first member in order to provide larger dimensional tolerances on assembly. Thus, accuracy constraints on the system are relaxed and the assembly is constructed as separate first and second housings containing respective parts.

In a further aspect the invention provides a seating member for fixing in a bore in a housing to serve as a seating for a member to be mounted within the housing having a wire extending therefrom, the seating member being formed of elastomeric material and having a central bore to permit the wire to extend therethrough, the elastomeric seating member having a lower cylindrical portion, an intermediate portion providing a shoulder and an upper corrugated portion, whereby in use the shoulder abuts against a shoulder provided by the housing bore, the corrugated portion resiliently engages the bore and the cylindrical portion engages an end of the member whereby the mounted member is permitted a small amount of movement.

As preferred, the seating member is operative to provide moisture resistant seals between the wire and the sides of the bore.

Thus, in accordance with the invention, limited movement of said member is permitted while retaining a moisture resistant seal. Thus, in the case where said member is a solenoid for a solenoid valve in an ABS controller, the housing containing the coils may be constructed as a separate module from the valve block whilst the seating member permits the coils the required degree of movement to allow for optimum positioning of the coils with respect to the valve block. Furthermore, since the seating member is arranged to provide moisture resistant seals, the electronic control circuitry for the solenoid valves can be housed in the second housing and be sealed from damaging ambient conditions.

Further, the wires extending from the solenoid to the upper housing may be coupled to a flexible portion of a circuit card in order to allow for misalignment between the wire and a connection on the circuit board.

BRIEF DESCRIPTION OF THE DRAWINGS

A preferred embodiment of the invention will now be described with reference to the accompanying drawings wherein:

FIG. 3b is a cross-sectional view of an alternative arrangement of part of the elastomeric member of FIG. 3a.

DESCRIPTION OF THE PREFERRED EMBODIMENT

Figure 2:
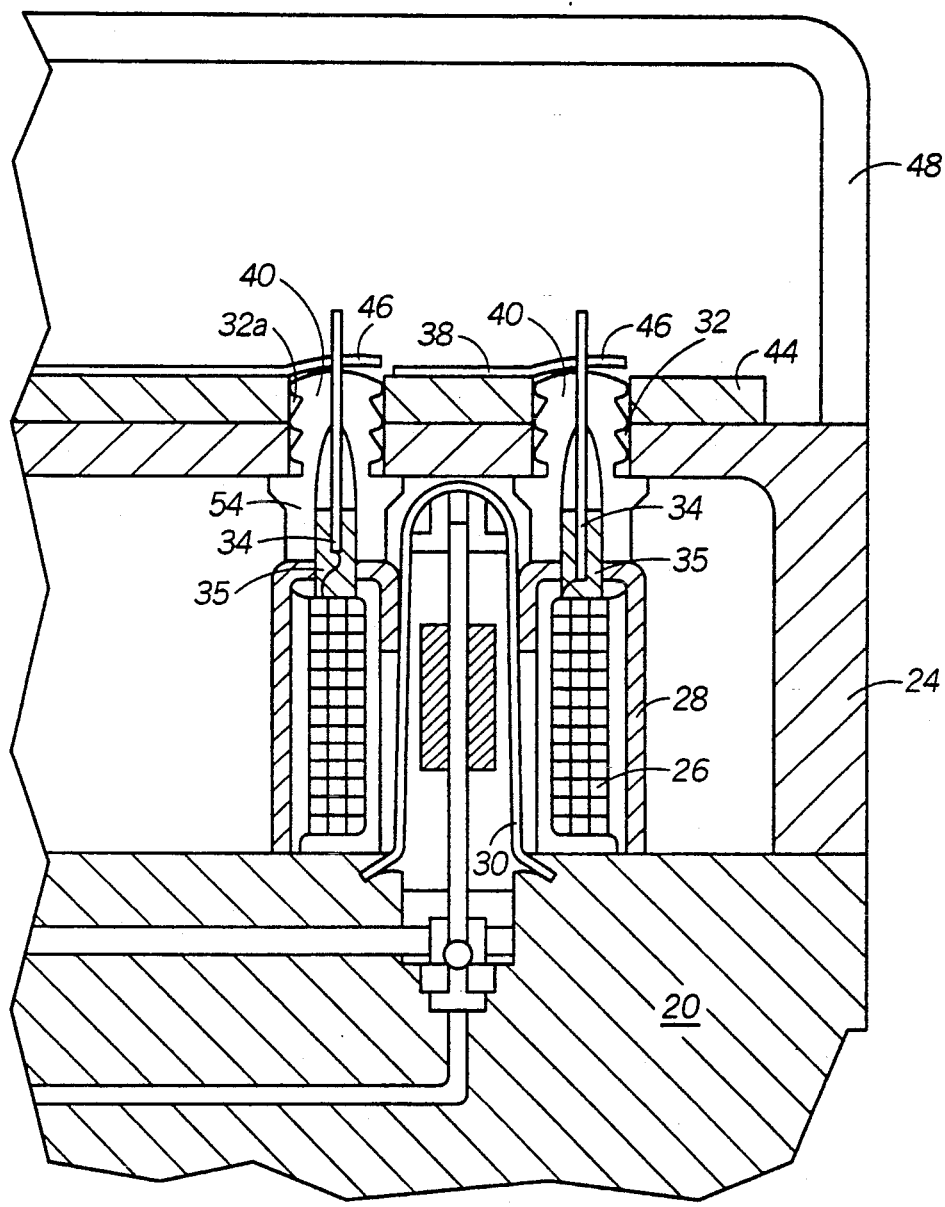
FIG. 2 is a side cross sectional view of an arrangement in accordance with the invention for an ABS controller.

Referring now to FIG. 2 of the drawings, a valve housing for an anti skid brake controller (ABS) (20) is of ferromagnetic material in order to conduct magnetic flux from an array of solenoids (22) (only one of which is shown) mounted in a housing (24).

Each solenoid comprises an annular coil (26) which surrounds a dome (30) and which is encased in a metal yoke (28). The dome (30) is made of non-magnetic material such as austenitic steel and contains the mechanical switch parts of the solenoid valve. Extending from the upper part of solenoid coils (26) are two stiff metal wire conductors (34) from plastic cap portions (35). Each wire (34) extends through a bore (32) of housing (24) in order to make electronic connection with a flexible circuit card (38). Elastomeric members (40) surround each wire (34) and are disposed in the bores (32). Elastomeric member (40) is described in more detail below with reference to FIGS. 3 and 4. Elastomeric member (40) provides a seating for the coil (26) and permits relative movement of the coil within the housing (24) to a certain extent determined by the flexibility of the elastomeric member.

Circuit card (38) (see FIG. 4) is connected to wires (34) through registering apertures (42) in the circuit card where a suitable electrical connection is made, e.g. a solder bump. Circuit card (38) is flexible and each aperture (42) is disposed in a movable finger portion (46) of circuit card (38) to permit movement of wires (34). Card (38) is mounted on a stiffening layer 44 of aluminium within a housing (48) which is mounted on top of housing (24) and is secured thereto by retaining bolts (49). The stiffening layer (44) has a plurality of bores (32a) which coincide with the bores (32) of the housing (24). An external port (47) is provided within the side of housing (48) to permit external electrical leads to be connected to circuit card (38) (not shown).

Figure 1:
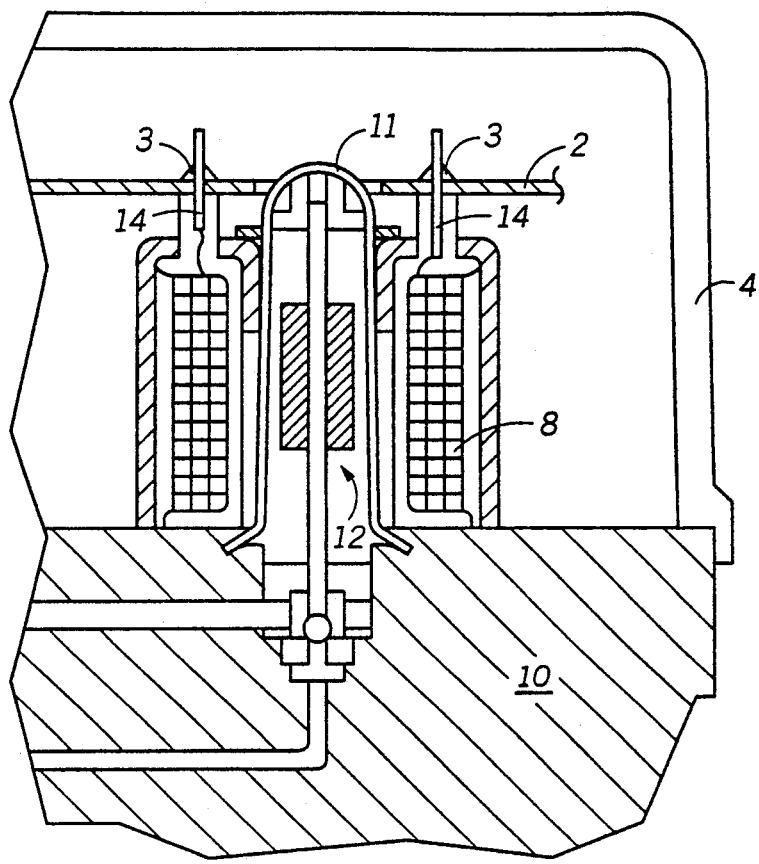
FIG. 1 is a schematic view of a prior art arrangement for an ABS controller.
Figure 3A:
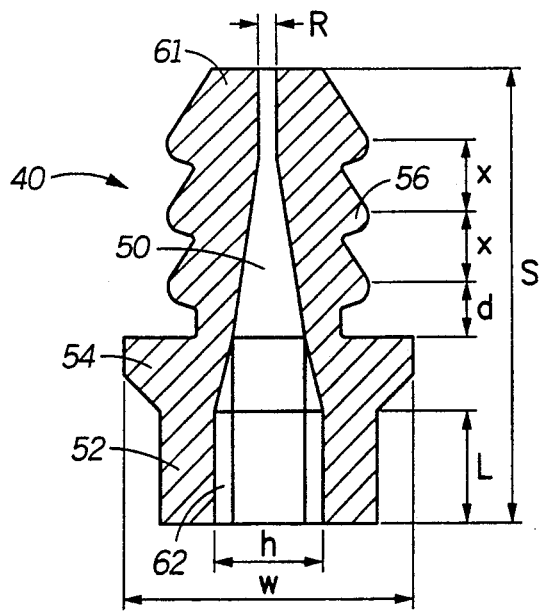
FIG. 3a is a detailed cross-sectional view of an elastomeric member for mounting a solenoid valve of FIG. 2.
Figure 4:
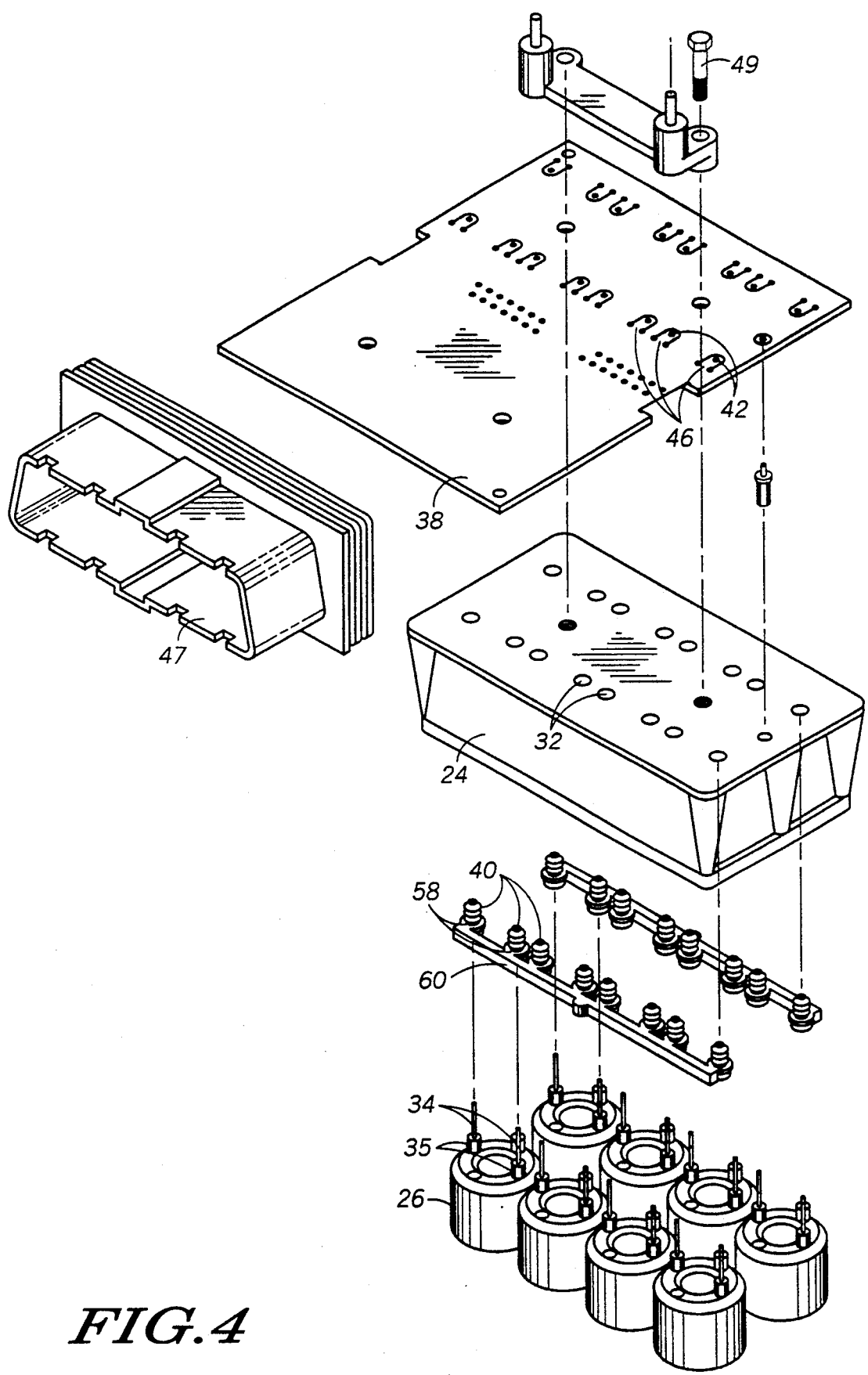
FIG. 4 is an exploded perspective view of the arrangement of FIG. 2.

Referring now to FIG. 3a, the seating member (40) is a generally cylindrical member having an internal tapering throughbore (50). The lower part of member (40) has a cylindrical skirt (52) which terminates in an annular portion (54). The upper part of member 40 has corrugations (56) on its external surface. As shown in FIG. 4, an array of seating members (40) are provided all connected through neck portions (58) to a base member portion (60). The formation of the seating members onto the base member permits all the seating members (40) to be mounted within the housing (24) in a single operation.

In the mounted position, the shoulders (54) sit against the internal surface of the housing (24) substantially adjacent the bore (32). The corrugations (56) fit tightly in bore (32) and bore (32a) in order to provide three separate sealing points to prevent the ingress of moisture into housing (48) from housing (24). Further the corrugations permit more flexibility than a portion having a constant cross-section. The wire (34) is gripped at the top portion (61) of the seating member to provide a moisture seal and the fitting of plastic cap portion (35) into the widest portion (62) of the bore provides a further moisture seal. This is an important feature of the invention since the electronic circuit which controls the operation of the solenoid valves is sealed in housing (48) against ambient conditions and so can be coupled directly to the solenoid coils via the leads (34).

A specific example of a seating member in accordance with the invention has the following dimensions: the distance x between each corrugation is 2 mm; the distance d between the first corrugation and the shoulder (54) is 1.5 mm; the internal diameter h of the cylindrical skirt (52) is 3.4 mm; the internal diameter R of the top portion (61) of the seating member for a wire (34) having a diameter of 0.8 mm is 0.6 mm; the widest part of the shoulder (54) has a width w of 8 mm; the height s of member 40 is 12.3 mm; and the length l of cylindrical skirt (52) is 2 mm.

Figure 3B:
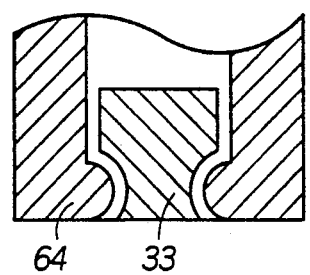

In an alternative arrangement, the lowest portion of skirt (52) as shown in FIG. 3b has an inwardly extending ring portion (64) which engages in registering annular grove (33) within plastic cap (35) as a snap fit as opposed to a friction fit.

The valve housing of an ABS controller in accordance with the invention is assembled as follows with particular reference to FIG. 4.

A plurality of solenoid coils (26) are arranged in a predetermined array. A plurality of seating members (40) formed on the base member (60) are mounted on the wires (34) extending from the plurality of solenoid coils (26) whereby each of the wires (34) is gripped by the top portion (61) of the seating member and the plastic cap portion (35) of the solenoid is securely held in the widest portion (62) of the seating member (40).

The solenoid coils (26) are mounted within the housing (24) by way of the seating members (40) which permit the coils (26) to be movable relative to the housing (24). The corrugation portions of the seating members (40) fit tightly with and extend through the bores (32) of the housing (24). The further ingress of seating member (40) into bore (32) is prevented by shoulder (54) which abuts against the internal surface of housing (24).

The circuit card (38) and stiffening layer (44) are then attached to the housing (24) so that the bores (32) and (32a) are aligned and the top corrugations of the seating member fit tightly within bores (32a). The wires (34) are then electrically connected to the circuit card (38) via the apertures (42) on the flexible finger portions (46). The electronic circuit card (38) is then sealed by housing (48) against ambient conditions.

Once the two housings (24) and (48) have been assembled as described above, the assembled arrangement is mounted on the valve block (20) which comprises a plurality of domes (30) containing the mechanical switching parts of the solenoid valves. Due to the flexibility of the seating members (40) the solenoid coils (26) slide over the domes and the coils are pressed against the surface of the dome (30) to provide optimum magnetic flux. The alignment of the coils is determined by the seating member (40).

Although the preferred embodiment of the invention has been described having a stiffening layer (44), this layer may be omitted.

Thus, it will be appreciated that due to the flexibility of the seating member in accordance with the invention, there is no necessity for precise dimensional accuracy in placement of the coils during initial installation. Thus, the housing containing the coils may be constructed as a separate module from the valve block whilst the seating member permits the coils the required degree of movement to allow for optimum positioning of the coils with respect to the valve block.

Furthermore, since the circuit card (38) is made of flexible material and the apertures (42) for the wires (34)

are formed on movable fingers (46), the electrical connection of the circuit card (38) to the solenoid coils (26) does not require precise alignment.

In addition, the housing (48) containing the circuit card can be sealed from the solenoid housing and the valve block and hence sealed against damaging ambient conditions. Thus, the electronic control circuitry can be connected directly to the solenoid coils and does not require additional conductors which can be damaged and which increase the required space as with the prior art assemblies.

We claim:

1. An assembly comprising:
   a first housing;
   a second housing, the first housing containing an array of first members mounted therein, said first members having respective wires extending therefrom for coupling said first members to electronic means sealed within the second housing; and
   at least one elastomeric seating member mounted within a bore communicating between the first and second housings, the elastomeric seating member extending from the bore into the first housing and securely engaging the first member so as to provide a set for the first member, the respective wire extending through the seating member and being grippingly engaged by the seating member such that the seating member provides a seal between the first and second housings and wherein the seating member permits the first member a small amount of movement to allow for alignment of the first member within the first housing.

2. An assembly as claimed in claim 1 wherein the seating member is arranged to provide moisture resistant seals between the wire and sides of the bore.

3. An assembly as claimed in claim 1 wherein the first members comprise solenoids of solenoid valves.

4. An assembly as claimed in claim 3 wherein the electronic means within the second housing comprises a circuit board of flexible material having a plurality of integral finger portions, wherein the wires extending from the solenoids are coupled to electrical contacts in the flexible integral finger portions.

5. An assembly as claimed in claim 3 wherein the first housing is mounted on a valve block of ferromagnetic material comprising switch parts of the solenoid valve, said elastomeric seating member permitting the movement of the solenoids for alignment with the switch parts of the solenoid valves.

6. An assembly as claimed in claim 1 wherein the first member further comprises a cap portion from which the respective wire extends, with cap portion engages in a cylindrical portion of the seating member.

7. An assembly as claimed in claim 6 wherein the cap portion and cylindrical portion have interacting annular rings and grooves.

8. An assembly as claimed in claim 1 wherein the seating member comprises:
   a lower cylindrical portion;
   an intermediate portion providing a shoulder; and
   an upper corrugated portion, whereby in use the shoulder abuts against a shoulder provided by the housing bore, the corrugated portion resiliently engages the bore and the cylindrical portion engages an end of the first member whereby the mounted member is permitted a small amount of movement.

9. An assembly as claimed in claim 8 wherein the corrugated portion is arranged to provide one or more moisture resistant seals against the housing bore wall.

10. An assembly as claimed in claim 8 wherein the corrugated portion comprises a plurality of annular ribs around the exterior of the elastomeric seating member.

11. An assembly as claimed in claim 8 wherein the seating member further comprises a central bore which narrows from the cylindrical portion to the upper corrugated portion such that the seating member engages with said wire in use.

12. An assembly as claimed in claim 8 wherein the end of the first member comprises a cap portion from which the respective wire extends, which cap portion engages in the cylindrical portion of the seating member.

13. An assembly as claimed in claim 12 wherein said cylindrical portion comprises an internal annular ring for engaging a groove in the cap portion.

14. An assembly as claimed in claim 8 including a plurality of said seating members connected to a flexible bar portion.

15. A seating member for fixing in a bore in a housing to serve as a seating for a first member to be mounted within the housing having a wire extending from an end thereof, the end of the first member comprising a cap portion from which the respective wire extends, the seating member being formed of elastomeric material and having a central bore to permit the wire to extend there through, the elastomeric seating member comprising:
   a lower cylindrical portion;
   an intermediate portion providing a shoulder; and
   an upper corrugated portion, whereby in use the lower cylindrical portion extends into the housing and engages the end of the first member, said cylindrical portion comprising an internal annular ring for engaging a groove in the cap portion, the seating member securely engages the wire, the shoulder of the seating member abuts against a housing shoulder provided by the housing bore, and the corrugated portion resiliently engages the bore whereby the mounted first member is permitted a small amount of movement so as to allow for alignment of the first member within the housing.

16. An elastomeric seating member as claimed in claim 15 wherein the corrugated portion is arranged to provide one or more moisture resistant seals against the housing bore wall.

17. An elastomeric seating member as claimed in claim 15 wherein the corrugated portion comprises a plurality of annular ribs around the exterior of the elastomeric seating member.

18. An elastomeric seating member as claimed in claim 15 wherein the central bore narrows from the cylindrical portion to the upper corrugated portion such that the seating member engages with said wire in use.

19. An elastomeric seating member as claimed in claim 15 including a plurality of said seating members connected to a flexible bar portion.

* * * * *

UNITED STATES PATENT AND TRADEMARK OFFICE
CERTIFICATE OF CORRECTION

PATENT NO. : 5,326,161
DATED : July 5, 1994
INVENTOR(S) : Adams et al.

It is certified that error appears in the above-identified patent and that said Letters Patent is hereby corrected as shown below:

Title page, item [54] and Col. 1, line 2, in the title "FLEXABLE" should rea --FLEXIBLE--.
In claim 1, column 5, line 25, "a set" should be --a seat--.

In claim 6, column 5, line 53, "with" should be --which--.

Signed and Sealed this

Twenty-seventh Day of August, 1996

Attest:

BRUCE LEHMAN

*Attesting Officer*  *Commissioner of Patents and Trademarks*